United States Patent
Stockstad et al.

(10) Patent No.: US 11,817,771 B2
(45) Date of Patent: Nov. 14, 2023

(54) GATE DRIVER HAVING A FLOATING SUPPLY NODE WITH SELECTIVE POWER RECEPTION FOR USE IN SWITCHING CONVERTERS

(71) Applicant: QUALCOMM Incorporated, San Diego, CA (US)

(72) Inventors: Troy Stockstad, Chandler, AZ (US); Gianluca Valentino, San Diego, CA (US); Ricardo Goncalves, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 236 days.

(21) Appl. No.: 17/319,749

(22) Filed: May 13, 2021

(65) Prior Publication Data

US 2022/0368324 A1  Nov. 17, 2022

(51) Int. Cl.
*H02M 1/08* (2006.01)
*H02M 3/158* (2006.01)
*H02M 1/00* (2006.01)

(52) U.S. Cl.
CPC .......... *H02M 1/08* (2013.01); *H02M 1/0006* (2021.05); *H02M 3/158* (2013.01)

(58) Field of Classification Search
CPC ...... H02M 1/08; H02M 1/0006; H02M 3/156; H02M 3/158
See application file for complete search history.

(56) References Cited

U.S. PATENT DOCUMENTS

| 5,966,036 A * | 10/1999 | Hoff | H03K 19/00361 |
| | | | 327/112 |
| 10,897,142 B2 * | 1/2021 | Kinzer | H01L 27/0248 |
| 2019/0074823 A1 | 3/2019 | Der et al. | |
| 2019/0140637 A1 * | 5/2019 | Chen | H03K 17/04123 |
| 2019/0238129 A1 * | 8/2019 | Fukushima | H02M 1/08 |
| 2021/0351686 A1 * | 11/2021 | Bognanni | H03K 17/063 |
| 2022/0006450 A1 * | 1/2022 | Fontana | H03K 17/063 |
| 2022/0077776 A1 * | 3/2022 | Saini | H03K 17/08122 |

FOREIGN PATENT DOCUMENTS

| EP | 3934097 A1 * | 1/2022 | .......... H03K 17/063 |

OTHER PUBLICATIONS

International Search Report and Written Opinion—PCT/US2022/072104—ISA/EPO—dated Aug. 11, 2022.

* cited by examiner

*Primary Examiner* — Alex Torres-Rivera
(74) *Attorney, Agent, or Firm* — Patterson + Sheridan, L.L.P.

(57) ABSTRACT

Techniques and apparatus for driving a transistor gate of a switched-mode power supply (SMPS) circuit. One example gate driver for a switching transistor of an SMPS circuit generally includes a first power supply rail; a reference rail; an output node for coupling to a control input of the switching transistor; a floating supply node; a pulldown transistor having a drain coupled to the output node of the gate driver and having a source coupled to the reference rail; and a pulldown logic buffer having a first power supply input coupled to the floating supply node, having a second power supply input coupled to the reference rail, and having an output coupled to a gate of the pulldown transistor. The floating supply node is configured to selectively receive power from the first power supply rail and the output node of the gate driver.

20 Claims, 4 Drawing Sheets

GATE DRIVER HAVING A FLOATING SUPPLY NODE WITH SELECTIVE POWER RECEPTION FOR USE IN SWITCHING CONVERTERS

TECHNICAL FIELD

Certain aspects of the present disclosure generally relate to electronic circuits and, more particularly, to a driver architecture for switched-mode power supplies.

BACKGROUND

A voltage regulator ideally provides a constant direct current (DC) output voltage regardless of changes in load current or input voltage. Voltage regulators may be classified as linear regulators or switching regulators. While linear regulators tend to be small and compact, many applications may benefit from the increased efficiency of a switching regulator (also referred to as a "switching converter"). A linear regulator may be implemented by a low-dropout (LDO) regulator, for example. A switching regulator may be implemented by a switched-mode power supply (SMPS), such as a buck converter, a boost converter, a buck-boost converter, or a charge pump.

For example, a buck converter is a type of SMPS typically comprising: (1) a high-side switch coupled between a relatively higher voltage rail and a switching node, (2) a low-side switch coupled between the switching node and a relatively lower voltage rail, (3) and an inductor coupled between the switching node and a load (e.g., represented by a shunt capacitive element). The high-side and low-side switches are typically implemented with transistors (referred to as "switching transistors"), although the low-side switch may alternatively be implemented with a diode.

A charge pump is a type of SMPS typically comprising at least one switching device to control the connection of a supply voltage across a load through a capacitor. In a voltage doubler, for example, the capacitor of the charge pump circuit may initially be connected across the supply, charging the capacitor to the supply voltage. The charge pump circuit may then be reconfigured to connect the capacitor in series with the supply and the load, doubling the voltage across the load. This two-stage cycle is repeated at the switching frequency for the charge pump. Charge pumps may be used to multiply or divide voltages by integer or fractional amounts, depending on the circuit topology.

Power management integrated circuits (power management ICs or PMICs) are used for managing the power requirement of a host system and may include and/or control one or more voltage regulators (e.g., buck converters or charge pumps). A PMIC may be used in battery-operated devices, such as mobile phones, tablets, laptops, wearables, etc., to control the flow and direction of electrical power in the devices. The PMIC may perform a variety of functions for the device such as DC-to-DC conversion (e.g., using a voltage regulator as described above), battery charging, power-source selection, voltage scaling, power sequencing, etc.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure provide a gate driver for a switching transistor of a power supply circuit. The gate driver generally includes a first power supply rail; a reference rail; an output node for coupling to a control input of the switching transistor; a floating supply node; a pulldown transistor having a drain coupled to the output node of the gate driver and having a source coupled to the reference rail; and a pulldown logic buffer having a first power supply input coupled to the floating supply node, having a second power supply input coupled to the reference rail, and having an output coupled to a gate of the pulldown transistor. The floating supply node is configured to selectively receive power from the first power supply rail and the output node of the gate driver.

Certain aspects of the present disclosure provide a power management integrated circuit (PMIC) comprising the gate driver described herein.

Certain aspects of the present disclosure provide a method of supplying power. The method generally includes receiving power at a floating supply node of a gate driver from a first power supply rail of the gate driver to power a pulldown logic buffer of the gate driver; receiving power at the floating supply node from a second power supply rail of the gate driver through an output node of the gate driver to power the pulldown logic buffer of the gate driver; and controlling, with the pulldown logic buffer, a pulldown transistor coupled to the output node of the gate driver.

Certain aspects of the present disclosure provide a gate driver for a high-side transistor in a switched-mode power supply circuit. The gate driver generally includes a first power supply rail; a reference rail; an output node for coupling to a gate of the high-side transistor; a floating supply node; a pulldown transistor having a drain coupled to the output node of the gate driver and having a source coupled to the reference rail; a pulldown logic buffer having a first power supply input coupled to the floating supply node, having a second power supply input coupled to the reference rail, and having an output coupled to a gate of the pulldown transistor; a first set of one or more diode devices coupled between the first power supply rail and the floating supply node; a second set of one or more diode devices coupled between the output node of the gate driver and the floating supply node; and a capacitive element coupled between the floating supply node and the reference rail.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
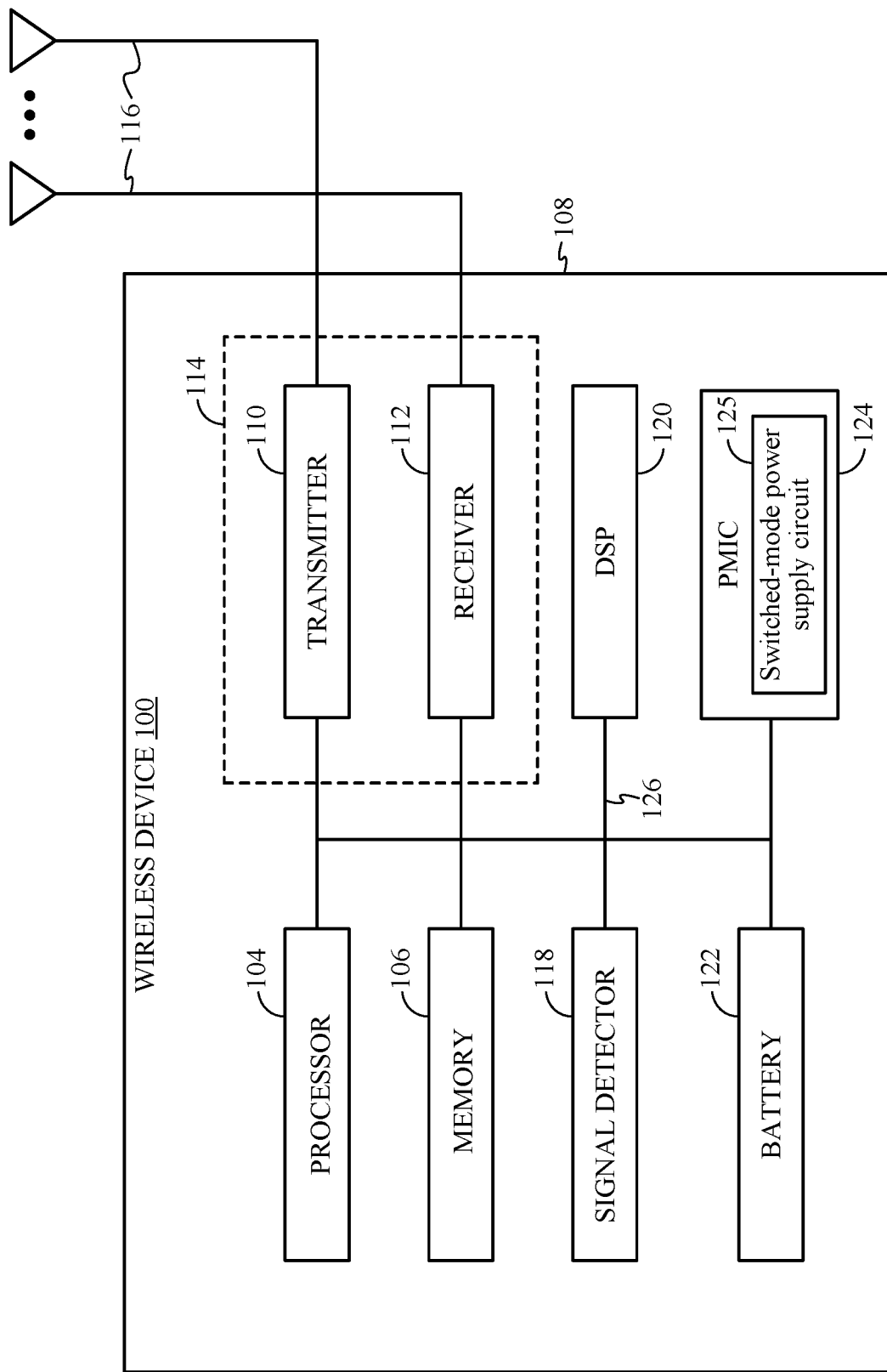
FIG. 1 is a block diagram of an example device that includes a switched-mode power supply (SMPS) circuit, in which aspects of the present disclosure may be practiced.

Certain aspects of the present disclosure provide techniques and apparatus for driving transistor gates of a switched-mode power supply (SMPS) circuit. One example apparatus is a gate driver having a floating supply node configured to selectively receive power from at least two different sources.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

It should be understood that aspects of the present disclosure may be used in a variety of applications. Although the present disclosure is not limited in this respect, the circuits disclosed herein may be used in any of various suitable apparatus, such as in a power supply, battery charging circuit, or power management circuit of a communication system, a video codec, audio equipment such as music players and microphones, a television, camera equipment, and test equipment such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCSs), personal digital assistants (PDAs), and the like.

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, an Internet of Things (IoT) device, a wearable device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically coupled to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC-to-DC conversion, battery charging, power-source selection, voltage scaling, power sequencing, etc. In certain aspects, the PMIC 124 may include at least a portion of a power supply circuit, which may include a switched-mode power supply circuit 125. In certain aspects, the PMIC 124 may include multiple power supply circuits, or at least portions thereof, and the multiple power supply circuits may share one or more voltage rails (e.g., VDD and/or VDDH as described below). The switched-mode power supply circuit 125 may be implemented by any of various suitable switched-mode power supply circuit topologies, such as a buck converter, a boost converter, an inverting buck-boost converter, or a charge pump. For certain aspects, the PMIC 124 may include a battery charging circuit (e.g., a master-slave battery charging circuit). For certain aspects, the power supply circuit may include a gate driver with a floating power supply node configured to selectively receive power from at least two different sources, as described herein.

The various components of the device 100 may be coupled together by a bus system 126, which may include a power bus, a control signal bus, and/or a status signal bus in addition to a data bus.

Example Power Supply Circuit

Figure 2:
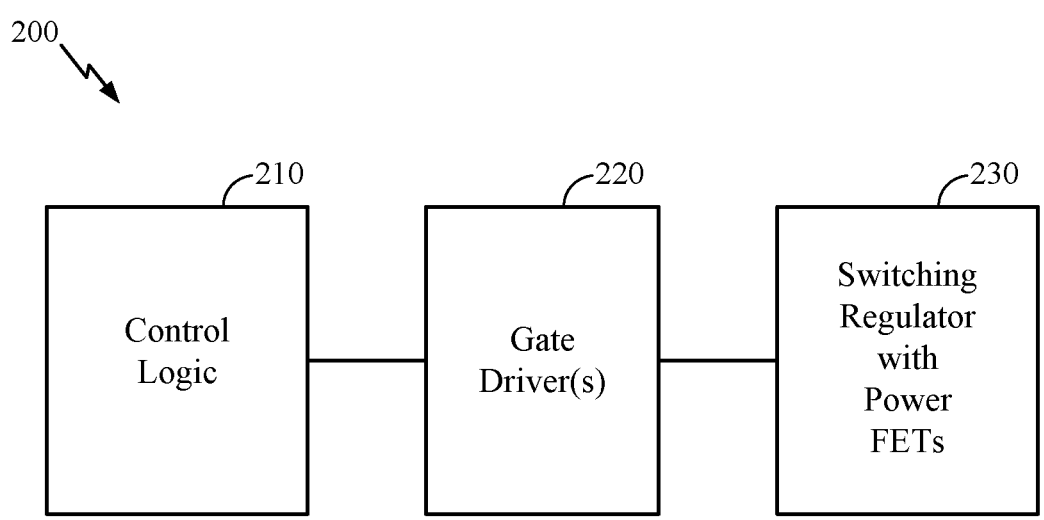
FIG. 2 is a block diagram of an example power supply circuit, in which aspects of the present disclosure may be practiced.

FIG. 2 is a block diagram of an example power supply circuit 200, in which aspects of the present disclosure may be practiced. The power supply circuit 200 may include control logic 210, one or more gate drivers 220, and a switching regulator 230. The control logic 210 may be implemented by a state machine, for example, and may output control signals to control the timing of components in the gate driver(s) 220. The gate driver(s) 220 may output signals with specified output signal swings to control the control inputs (e.g., the gates) of switching devices (e.g., switching transistors, such as power field-effect transistors (FETs)) in the switching regulator 230. One or more of the gate drivers 220 may have a floating supply node configured to selectively receive power from at least two different sources, such as a power supply rail for the gate driver and an output node of the gate driver, as described herein. The switching regulator 230 may be implemented as any of various suitable switching converter topologies, such as a buck converter, a boost converter, a buck-boost converter, a charge pump, and the like. The switching regulator 230 may include a high-side transistor and a low-side transistor.

High-side n-type field-effect transistor (NFET) power stages may be more desirable than high-side p-type field-effect transistor (PFET) power stages, due to a higher figure of merit for NFETs compared to PFETs. For example, a buck converter with a high-side NFET power stage may typically have a higher peak efficiency for the same drain-to-source on-resistance ($R_{ds,on}$) compared to a high-side PFET power stage. To provide overdrive to the gate-to-source voltage ($V_{GS}$) of the high-side NFET, thereby lowering the $R_{ds,on}$ for increased efficiency, it may be desirable to provide the gate driver for the high-side NFET with a power supply having a greater voltage than the input voltage (e.g., the drain voltage for the NFET). In this case, a "boot" capacitor may be used to provide a source of charge to drive the gate of the high-side NFET with the gate driver. The boot capacitor may be coupled between the power terminals of a high-side gate driver, where one power terminal is coupled to the power supply rail with the voltage greater than the input voltage and where the other power terminal may be coupled to the switching node of the switching regulator 230 (e.g., between the high-side and low-side transistors). This boot capacitor may be an external component or an integrated component (e.g., external to or integrated in the PMIC or other integrated circuit (IC) with the gate driver(s) 220 and the switching regulator 230). An external capacitor generally is coupled to a pin of the IC, so each such switching regulator in an IC may have an IC pin for connecting to its respective external boot capacitor. Although integrated capacitors need no IC pin for external access, integrated capacitors may occupy significant area within an IC die.

Example Gate Driver with Floating Boot Supply

Certain aspects of the present disclosure provide apparatus and techniques for driving gates of power transistors in a switching regulator with a significantly smaller boot capacitor. This may be accomplished with a gate driver architecture where the pulldown path is on a floating boot supply. This floating boot supply may be configured to receive power from at least two different sources and charge the boot capacitor via at least two different charge paths. The gate driver architecture may also have a pullup path to a high voltage supply (greater than the input voltage for the high-side transistor), and this high voltage supply may be shared among multiple switching regulators.

Figure 3:
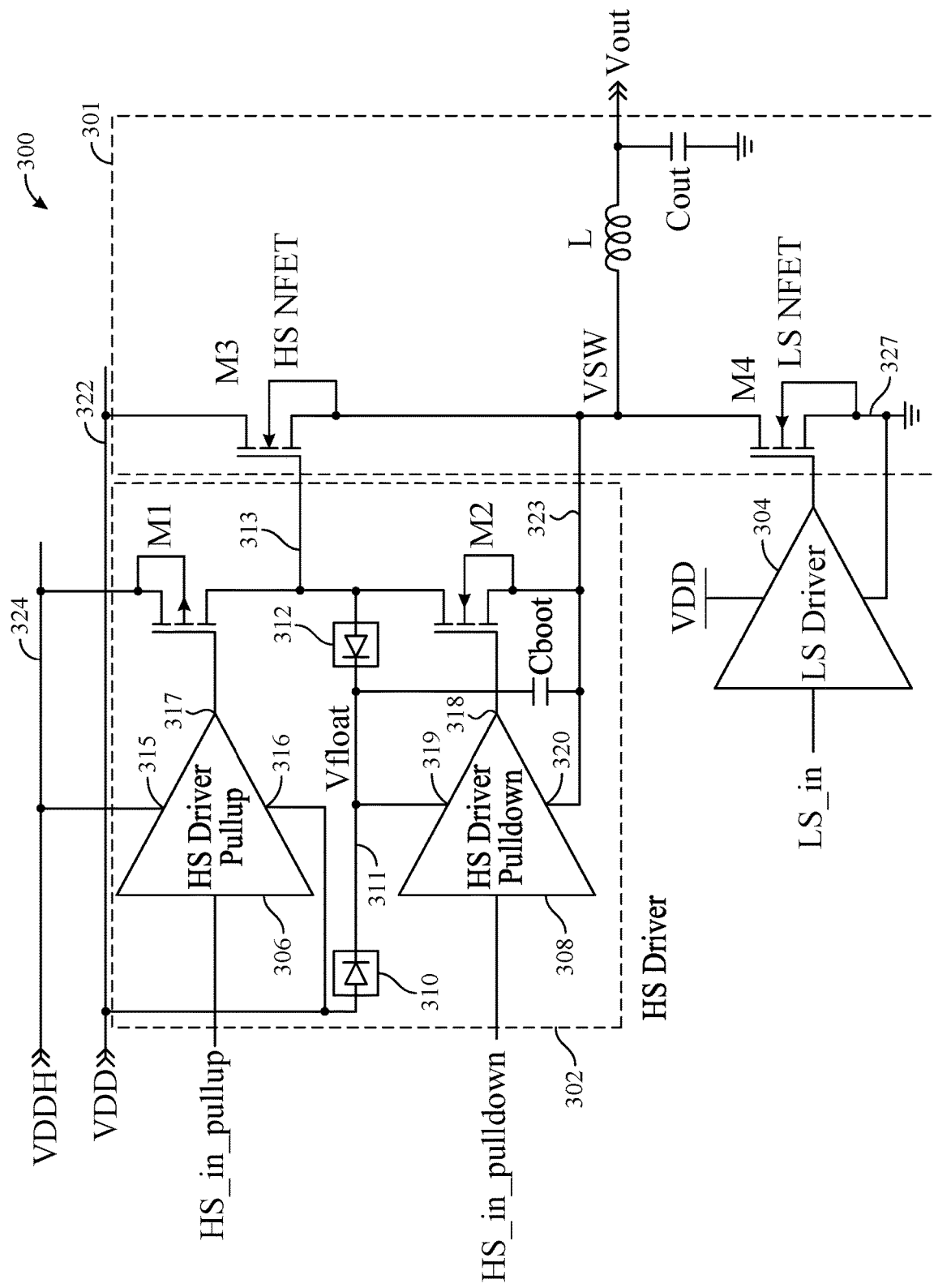
FIG. 3 is a circuit diagram of a buck converter and an example high-side gate driver for driving the gate of the high-side switching transistor, in accordance with certain aspects of the present disclosure.

FIG. 3 is a circuit diagram of a power supply circuit 300 with a buck converter 301, a high-side gate driver 302, and a low-side gate driver 304, in accordance with certain aspects of the present disclosure. In this example, the switched-mode power supply (e.g., the switching regulator 230) is implemented as a buck converter. However, it is to be understood that the switched-mode power supply may alternatively be implemented as any of other various suitable switching converter topologies, such as a boost converter, a buck-boost converter, a three-level buck converter, or a charge pump.

As illustrated in FIG. 3, the buck converter 301 includes a high-side switching transistor M3, a low-side switching transistor M4, a series inductive element L (e.g., implemented by one or more inductors), and a shunt capacitive element Cout (e.g., implemented by one or more capacitors). The high-side transistor M3 may be implemented by an n-type transistor (e.g., an n-type field-effect transistor (NFET)), as shown. In this case, transistor M3 may have a drain coupled to a first power supply rail 322 (labeled "VDD"), a source coupled to a switching node (labeled "VSW") of the buck converter, and a gate coupled to an output node 313 of the high-side gate driver 302. The low-side transistor M4 may also be implemented by an n-type transistor (e.g., an NFET), as shown. In this case, transistor M4 may have a drain coupled to the switching node, a source coupled to a reference potential node (e.g., electrical ground 327) of the buck converter, and a gate coupled to an output of the low-side gate driver 304. The inductive element L may be coupled between the switching node and an output node (labeled "VOUT") of the buck converter, and the capacitive element Cout may be coupled between the output node and the reference potential node of the buck converter.

The low-side gate driver 304 may receive an input signal (labeled "LS_in") and drive the gate of switching transistor M4 based on LS_in. The input signal LS_in may represent a low-side pullup input signal and a low-side pulldown input signal (not shown). The low-side gate driver 304 may have a first power supply input coupled to the first power supply rail 322 (VDD) and have a second power supply input coupled to the reference potential node of the buck converter. Therefore, the low-side gate driver 304 may output control signals having voltages ranging from 0 V to VDD.

The high-side gate driver 302 may receive a high-side pullup input signal (labeled "HS_in_pullup") and a high-side pulldown input signal (labeled "HS_in_pulldown") and drive the gate of switching transistor M3 based on these high-side input signals. The high-side gate driver 302 may include a high-side pullup logic buffer 306, a high-side pulldown logic buffer 308, a pullup transistor M1, a pulldown transistor M2, a first set of one or more diode devices 310, a second set of one or more diode devices 312, and a capacitive element Cboot (e.g., implemented by one or more capacitors). The pullup logic buffer 306 may have an input receiving the HS_in_pullup signal, a first power supply input 315 coupled to a second power supply rail 324 (labeled "VDDH"), a second power supply input 316 coupled to the first power supply rail 322 (VDD), and an output 317 coupled to the gate of transistor M1. In this manner, pullup logic buffer 306 may output control signals having voltages ranging from VDD to VDDH. Transistor M1 may be a p-type transistor (e.g., a p-type field-effect transistor (PFET)), may have a source (and body) coupled to the second power supply rail 324, and may have a drain coupled to the output node 313 of the high-side gate driver 302. The second power supply rail 324 may have a higher voltage than the first power supply rail 322 (VDDH>VDD), such that the high-side gate driver 302 can pull up the output node 313 to voltage levels greater than VDD and decrease the drain-to-source on-resistance of the switching transistor M3, thereby reducing conductive loss through transistor M3 and increasing efficiency of the buck converter.

The pulldown logic buffer 308 may have an input receiving the HS_in_pulldown signal, a first power supply input 319 coupled to a floating supply node 311 (labeled "Vfloat"), a second power supply input 320 coupled to a reference rail 323 of the high-side gate driver 302, and an output 318 coupled to the gate of transistor M2. The reference rail 323 of the high-side gate driver 302 may be coupled to the switching node VSW of the buck converter. In this manner, the pulldown logic buffer 308 is referenced to VSW (i.e., to the source of the switching transistor M3, rather than referenced to ground, for instance) and may output control signals having voltages ranging from VSW to Vfloat, where VSW may swing from 0 V to VDD, depending on a duty cycle of the buck converter. Transistor M2 may be an n-type transistor (e.g., an NFET), may have a source (and body) coupled to the reference rail 323, and may have a drain coupled to the output node 313 of the high-side gate driver 302.

The first set of one or more diode devices 310 may be coupled between the first power supply rail 322 (VDD) and the floating supply node 311. The first set of diode devices 310 may include one or more unidirectional devices (also known as current-steering devices). For example, the first set of diode devices 310 may be implemented by diodes or diode-connected transistors. In this case, a diode (or diode-connected transistor) in the first set may have an anode coupled to the first power supply rail 322 and may have a cathode coupled to the floating supply node 311. When the first set of diode devices 310 includes multiple diode devices, these devices may be connected in series.

The second set of one or more diode devices 312 may be coupled between the output node 313 of the high-side gate driver 302 and the floating supply node 311. The second set of diode devices 312 may include one or more unidirectional devices. For example, the second set of diode devices 312 may be implemented by diodes or diode-connected transistors. In this case, a diode (or diode-connected transistor) in the second set may have an anode coupled to the output node 313 of the high-side gate driver 302 and may have a cathode coupled to the floating supply node 311. When the second set of diode devices 310 includes multiple diode devices, these devices may be connected in series. For certain aspects, the second set of diode devices 312 may include a buffer, such as a source follower. In this case, the source follower may include a transistor (e.g., an NFET) with a gate coupled to the output node 313 and with a source coupled to the floating supply node 311.

Capacitive element Cboot is coupled between the floating supply node 311 and the reference rail 323. The capacitive element Cboot may have a smaller capacitance (e.g., around 20 pF) and may occupy a smaller area, compared to conventional gate drivers. The first and second sets of diode devices 310, 312 provide two different charge paths through the capacitive element Cboot.

During operation, the logic buffers 306, 308 may receive control signals (e.g., HS_in_pullup and HS_in_pulldown) from the control logic and output signals for driving the gates of transistors M1, M2. In certain aspects, the buffer output signals may have higher voltage swings than the control signals (e.g., lower logic-level signals) received from the control logic. For example, the output signal from the pullup logic buffer 306 may swing between VDD and VDDH, where VDDH is greater than VDD, and the output signal from the pulldown logic buffer 308 may swing between VSW and Vfloat. When HS_in_pulldown is asserted (and HS_in_pullup is deasserted) such that the pulldown transistor M2 is turned on (and the pullup transistor M1 is turned off), the output node 313 of the gate driver will be pulled down to the voltage of the reference rail 323 (VSW), such that the high-side switching transistor M3 is turned off. In this scenario, the floating supply node 311 may receive power from the first power supply rail 322 through the first set of diode devices 310, and thus, Vfloat may be close to VDD (e.g., one or more forward-biased diode drops away from VDD). The output node 313 is at VSW, so the second set of diode devices 312 is reverse biased (VSW being less than VDD in this scenario). Thus, the capacitive element Cboot may be charged through the first set of diode devices 310 as a first charge path.

At other times when HS_in_pulldown is deasserted (and HS_in_pullup is asserted) such that the pulldown transistor M2 is turned off (and the pullup transistor M1 is turned on), the output node 313 of the gate driver will be pulled up to VDDH, such that the high-side switching transistor M3 is turned on and VSW rises to VDD. In this scenario, the floating supply node 311 may receive power from the second power supply rail 324 through the pullup transistor M1, the output node 313, and the second set of diode devices 312, and thus, Vfloat may be close to VDDH (e.g., one or more forward-biased diode drops away from VDDH). Since Vfloat is approximately VDDH, which is greater than VDD, the first set of diode devices 310 is reverse biased in this scenario. Thus, the capacitive element Cboot may be charged through the pullup transistor M1 and the second set of diode devices 312 as a second charge path.

In this manner, the output signal from the high-side gate driver 302 on the output node 313 may be pulled down to VSW to turn off switching transistor M3 and may be pulled up to VDDH (e.g., to the second power supply rail 324) to turn on transistor M3, according to the switching frequency and duty cycle of the buck converter 301, as controlled by the control logic. Likewise, another output signal from the low-side gate driver 304 may be used to control operation of the switching transistor M4, where the gate may be pulled up to VDD (logic high) to turn on transistor M4 and may be pulled down to ground (logic low) to turn off transistor M4. The gate signals may be operated in a break-before-make fashion, such that transistor M3 is turned off before transistor M4 is turned on, and vice versa. As explained above, VOUT is controlled based on the duty cycle of switching the transistors M3 and M4.

The gate driver architecture described herein offers several advantages in addition to lower area, due to smaller boot capacitance and decreased boot capacitor area. For example, the gate drive architecture supplies charge to the boot capacitor during both the on and off phases of the high-side switching transistor, rather than only when the high-side switching transistor is off (when VSW=0 V). The concern for having a discharge path for larger boot capacitors in conventional gate driver architectures is removed, and thus, the switching regulator need not be limited to a maximum duty cycle and can operate at a duty cycle of 100%. In addition, the gate driver architecture described herein has a pulldown path that returns high-side switching transistor gate charge to the output of the regulator, rather than to ground, thereby achieving higher efficiency. Furthermore, sharing the higher voltage supply rail (VDDH) among multiple switching regulators eliminates large boot capacitors (external or integrated) for the pullup paths in the regulators and thereby reduces overall system cost and area.

Example Operations for Supplying Power

Figure 4:
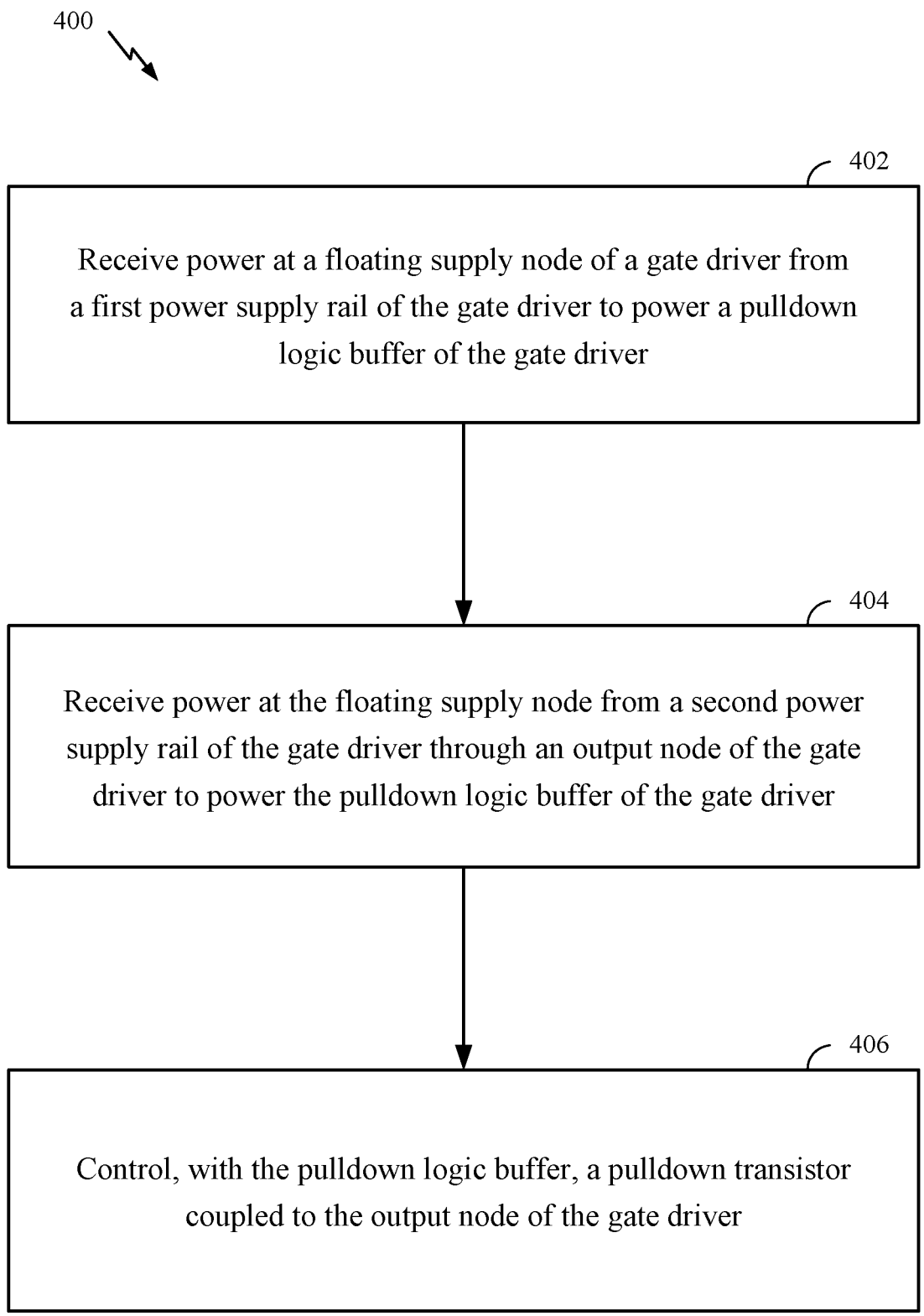
FIG. 4 is a flow diagram of example operations for supplying power, in accordance with certain aspects of the present disclosure.

FIG. 4 is a flow diagram of example operations 400 for supplying power, in accordance with certain aspects of the present disclosure. The operations 400 may be performed by a power supply circuit (e.g., power supply circuit 300) with a gate driver having a floating power supply node configured to selectively receive power from at least two different sources, such as the high-side gate driver 302 of FIG. 3.

The operations 400 may begin, at block 402, with a floating supply node (e.g., floating supply node 311) of a gate driver (e.g., high-side gate driver 302) receiving power (e.g., receiving current) from a first power supply rail (e.g., the first power supply rail 322 (VDD)) of the gate driver to power a pulldown logic buffer (e.g., the pulldown logic buffer 308) of the gate driver. At block 404, the floating node may receive power (e.g., receive current) from a second power supply rail (e.g., the second power supply rail 324 (VDDH)) of the gate driver through an output node (e.g., the output node 313) of the gate driver to power the pulldown logic buffer of the gate driver. At block 406, the pulldown logic buffer may control a pulldown transistor (e.g., transistor M2) coupled to the output node of the gate driver.

According to certain aspects, the operations 400 may further involve receiving power from the second power supply rail to power a pullup logic buffer (e.g., the pullup logic buffer 306). The pullup logic buffer may be referenced to the first power supply rail, which may having a higher voltage than the first power supply rail. In this case, the pullup logic buffer may control a pullup transistor (e.g., transistor M1) coupled to the output node of the gate driver. The pullup transistor may be coupled between the second power supply rail and the output node, and/or the pulldown transistor may be coupled between the output node and a reference rail (e.g., the reference rail 323) of the gate driver. For example, the pullup transistor may have a drain coupled to the output node of the gate driver and may have a source coupled to the second power supply rail. The pulldown transistor may have a drain coupled to the output node of the gate driver and may have a source coupled to the reference rail. The reference rail may be coupled to a switching node (e.g., node VSW) of a switched-mode power supply (e.g., a buck converter, such as the buck converter 301). The operations 400 may further include charging a capacitive element (e.g., capacitor Cboot) coupled between the floating supply node and the reference rail from at least one of the first power supply rail or the second power supply rail through the output node of the gate driver. The capacitive element may be charged during an on phase and an off phase of a switching transistor (e.g., transistor M3).

According to certain aspects, power at the floating supply node is received from the first power supply rail (e.g., at block 402) when the pulldown transistor is turned on and the pullup transistor is turned off. For certain aspects, power at the floating supply node is received from the second power supply rail (e.g., at block 404) when the pullup transistor is turned on and the pulldown transistor is turned off.

According to certain aspects, receiving power from the first power supply rail at block 402 involves receiving power through a first set of one or more diode devices (e.g., the first set of one or more diode devices 310) coupled between the first power supply rail and the floating supply node. The first set of one or more diode devices may include a diode or a diode-connected transistor having an anode coupled to the first power supply rail and having a cathode coupled to the floating supply node For certain aspects, receiving power from second power supply rail through the output node of the gate driver at block 404 includes receiving power through a second set of one or more diode devices (e.g., the second set of one or more diode devices 312) coupled between the output node of the gate driver and the floating supply node. The second set of one or more diode devices may include a diode or a diode-connected transistor having an anode coupled to the output node of the gate driver and having a cathode coupled to the floating supply node. Additionally or alternatively, the second set of one or more diode devices may include a source follower having a transistor with a gate coupled to the output node and with a source coupled to the floating supply node.

Example Aspects

In addition to the various aspects described above, specific combinations of aspects are within the scope of the disclosure, some of which are detailed below:

Aspect 1: A gate driver for a switching transistor of a power supply circuit, the gate driver comprising: a first power supply rail; a reference rail; an output node for coupling to a control input of the switching transistor; a floating supply node; a pulldown transistor having a drain coupled to the output node of the gate driver and having a source coupled to the reference rail; and a pulldown logic buffer having a first power supply input coupled to the floating supply node, having a second power supply input coupled to the reference rail, and having an output coupled to a gate of the pulldown transistor, wherein the floating supply node is configured to selectively receive power from the first power supply rail and the output node of the gate driver.

Aspect 2: The gate driver of Aspect 1, further comprising: a first set of one or more diode devices coupled between the first power supply rail and the floating supply node; a second set of one or more diode devices coupled between the output node of the gate driver and the floating supply node; and a capacitive element coupled between the floating supply node and the reference rail.

Aspect 3: The gate driver of Aspect 2, wherein the first set of one or more diode devices comprises a diode or a diode-connected transistor having an anode coupled to the first power supply rail and having a cathode coupled to the floating supply node.

Aspect 4: The gate driver of Aspect 2 or Aspect 3, wherein the second set of one or more diode devices comprises a diode or a diode-connected transistor having an anode coupled to the output node of the gate driver and having a cathode coupled to the floating supply node.

Aspect 5: The gate driver of Aspect 2 or Aspect 3, wherein the second set of one or more diode devices comprises a source follower having a transistor with a gate coupled to the output node and with a source coupled to the floating supply node.

Aspect 6: The gate driver of any preceding Aspect, further comprising: a second power supply rail having a higher voltage than the first power supply rail; a pullup transistor having a drain coupled to the output node of the gate driver and having a source coupled to the second power supply rail; and a pullup logic buffer having a first power supply input coupled to the second power supply rail, having a second power supply input coupled to the first power supply rail, and having an output coupled to a gate of the pullup transistor.

Aspect 7: The gate driver of Aspect 6, wherein the pulldown transistor comprises an n-type transistor and wherein the pullup transistor comprises a p-type transistor.

Aspect 8: The gate driver of any preceding Aspect, wherein the floating supply node is configured to supply charge during an on phase and an off phase of the switching transistor.

Aspect 9: A power management integrated circuit (PMIC) comprising the gate driver of any preceding Aspect.

Aspect 10: A switched-mode power supply circuit comprising the gate driver of any preceding Aspect, the switched-mode power supply circuit further comprising: the switching transistor having a drain coupled to the first power supply rail, having a gate coupled to the output node of the gate driver, and having a source coupled to the reference rail of the gate driver; another gate driver; and another switching transistor having a drain coupled to the source of the switching transistor, having a source coupled to a reference potential node of the switched-mode power supply circuit, and having a gate coupled to an output node of the other gate driver.

Aspect 11: A gate driver for a high-side transistor in a switched-mode power supply circuit, the gate driver comprising: a first power supply rail; a reference rail; an output node for coupling to a gate of the high-side transistor; a floating supply node; a pulldown transistor having a drain coupled to the output node of the gate driver and having a source coupled to the reference rail; a pulldown logic buffer having a first power supply input coupled to the floating supply node, having a second power supply input coupled to the reference rail, and having an output coupled to a gate of the pulldown transistor; a first set of one or more diode devices coupled between the first power supply rail and the floating supply node; a second set of one or more diode devices coupled between the output node of the gate driver and the floating supply node; and a capacitive element coupled between the floating supply node and the reference rail.

Aspect 12: A method of supplying power, comprising: receiving power at a floating supply node of a gate driver from a first power supply rail of the gate driver to power a pulldown logic buffer of the gate driver; receiving power at the floating supply node from a second power supply rail of the gate driver through an output node of the gate driver to power the pulldown logic buffer of the gate driver; and controlling, with the pulldown logic buffer, a pulldown transistor coupled to the output node of the gate driver.

Aspect 13: The method of Aspect 12, further comprising: receiving power from the second power supply rail to power a pullup logic buffer, the pullup logic buffer being referenced to the first power supply rail; and controlling, with the pullup logic buffer, a pullup transistor coupled to the output node of the gate driver.

Aspect 14: The method of Aspect 13, wherein: the pullup transistor is coupled between the second power supply rail and the output node; the pulldown transistor is coupled between the output node and a reference rail of the gate driver; and the reference rail is coupled to a switching node of a switched-mode power supply.

Aspect 15: The method of Aspect 14, further comprising charging a capacitive element coupled between the floating supply node and the reference rail from at least one of the first power supply rail or the second power supply rail through the output node of the gate driver.

Aspect 16: The method of Aspect 13, wherein: power at the floating supply node is received from the first power supply rail when the pulldown transistor is turned on and the pullup transistor is turned off; and power at the floating supply node is received from the second power supply rail when the pullup transistor is turned on and the pulldown transistor is turned off.

Aspect 17: The method of any of Aspects 12-16, wherein: receiving power from the first power supply rail comprises receiving power through a first set of one or more diode devices coupled between the first power supply rail and the floating supply node; and receiving power from second power supply rail through the output node of the gate driver comprises receiving power through a second set of one or more diode devices coupled between the output node of the gate driver and the floating supply node.

The various operations of methods described above may be performed by any suitable means capable of performing the corresponding functions. The means may include various hardware and/or software component(s) and/or module(s), including, but not limited to a circuit, an application-specific integrated circuit (ASIC), or a processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A gate driver for a switching transistor of a power supply circuit, the gate driver comprising:
   a first power supply rail;
   a reference rail;
   an output node for coupling to a control input of the switching transistor;
   a floating supply node;
   a pulldown transistor having a drain coupled to the output node of the gate driver and having a source coupled to the reference rail; and
   a pulldown logic buffer having a first power supply input coupled to the floating supply node, having a second power supply input coupled to the reference rail, and having an output coupled to a gate of the pulldown transistor, wherein the floating supply node is configured to selectively receive power from the first power supply rail and the output node of the gate driver.

2. The gate driver of claim 1, further comprising:
   a first set of one or more diode devices coupled between the first power supply rail and the floating supply node;
   a second set of one or more diode devices coupled between the output node of the gate driver and the floating supply node; and
   a capacitive element coupled between the floating supply node and the reference rail.

3. The gate driver of claim 2, wherein the first set of one or more diode devices comprises a diode or a diode-connected transistor having an anode coupled to the first power supply rail and having a cathode coupled to the floating supply node.

4. The gate driver of claim 2, wherein the second set of one or more diode devices comprises a diode or a diode-connected transistor having an anode coupled to the output node of the gate driver and having a cathode coupled to the floating supply node.

5. The gate driver of claim 2, wherein the second set of one or more diode devices comprises a source follower having a transistor with a gate coupled to the output node and with a source coupled to the floating supply node.

6. The gate driver of claim 1, further comprising:
   a second power supply rail having a higher voltage than the first power supply rail;
   a pullup transistor having a drain coupled to the output node of the gate driver and having a source coupled to the second power supply rail; and
   a pullup logic buffer having a first power supply input coupled to the second power supply rail, having a second power supply input coupled to the first power supply rail, and having an output coupled to a gate of the pullup transistor.

7. The gate driver of claim 6, wherein the pulldown transistor comprises an n-type transistor and wherein the pullup transistor comprises a p-type transistor.

8. The gate driver of claim 1, wherein the floating supply node is configured to supply charge during an on phase and an off phase of the switching transistor.

9. A power management integrated circuit (PMIC) comprising the gate driver of claim 1.

10. A switched-mode power supply circuit comprising the gate driver of claim 1, the switched-mode power supply circuit further comprising:
    the switching transistor having a drain coupled to the first power supply rail, having a gate coupled to the output node of the gate driver, and having a source coupled to the reference rail of the gate driver;
    another gate driver; and
    another switching transistor having a drain coupled to the source of the switching transistor, having a source coupled to a reference potential node of the switched-mode power supply circuit, and having a gate coupled to an output node of the other gate driver.

11. A gate driver for a high-side transistor in a switched-mode power supply circuit, the gate driver comprising:
    a first power supply rail;
    a reference rail;
    an output node for coupling to a gate of the high-side transistor;
    a floating supply node;
    a pulldown transistor having a drain coupled to the output node of the gate driver and having a source coupled to the reference rail;
    a pulldown logic buffer having a first power supply input coupled to the floating supply node, having a second power supply input coupled to the reference rail, and having an output coupled to a gate of the pulldown transistor;
    a first set of one or more diode devices coupled between the first power supply rail and the floating supply node;
    a second set of one or more diode devices coupled between the output node of the gate driver and the floating supply node; and
    a capacitive element coupled between the floating supply node and the reference rail.

12. The gate driver of claim 11, wherein:
    the first set of one or more diode devices comprises a diode or a diode-connected transistor having an anode coupled to the first power supply rail and having a cathode coupled to the floating supply node; and
    the second set of one or more diode devices comprises a diode or a diode-connected transistor having an anode coupled to the output node of the gate driver and having a cathode coupled to the floating supply node.

13. The gate driver of claim 11, wherein:
    the first set of one or more diode devices comprises a diode or a diode-connected transistor having an anode coupled to the first power supply rail and having a cathode coupled to the floating supply node; and
    the second set of one or more diode devices comprises a source follower having a transistor with a gate coupled to the output node and with a source coupled to the floating supply node.

14. The gate driver of claim 11, further comprising:
    a second power supply rail having a higher voltage than the first power supply rail;
    a pullup transistor having a drain coupled to the output node of the gate driver and having a source coupled to the second power supply rail; and
    a pullup logic buffer having a first power supply input coupled to the second power supply rail, having a second power supply input coupled to the first power supply rail, and having an output coupled to a gate of the pullup transistor.

15. A method of supplying power, comprising:
receiving power at a floating supply node of a gate driver from a first power supply rail of the gate driver to power a pulldown logic buffer of the gate driver;
receiving power at the floating supply node from a second power supply rail of the gate driver through an output node of the gate driver to power the pulldown logic buffer of the gate driver; and
controlling, with the pulldown logic buffer, a pulldown transistor coupled to the output node of the gate driver.

16. The method of claim 15, further comprising:
receiving power from the second power supply rail to power a pullup logic buffer, the pullup logic buffer being referenced to the first power supply rail; and
controlling, with the pullup logic buffer, a pullup transistor coupled to the output node of the gate driver.

17. The method of claim 16, wherein:
the pullup transistor is coupled between the second power supply rail and the output node;
the pulldown transistor is coupled between the output node and a reference rail of the gate driver; and
the reference rail is coupled to a switching node of a switched-mode power supply.

18. The method of claim 17, further comprising charging a capacitive element coupled between the floating supply node and the reference rail from at least one of the first power supply rail or the second power supply rail through the output node of the gate driver.

19. The method of claim 16, wherein:
power at the floating supply node is received from the first power supply rail when the pulldown transistor is turned on and the pullup transistor is turned off; and
power at the floating supply node is received from the second power supply rail when the pullup transistor is turned on and the pulldown transistor is turned off.

20. The method of claim 15, wherein:
receiving power from the first power supply rail comprises receiving power through a first set of one or more diode devices coupled between the first power supply rail and the floating supply node; and
receiving power from the second power supply rail through the output node of the gate driver comprises receiving power through a second set of one or more diode devices coupled between the output node of the gate driver and the floating supply node.

\* \* \* \* \*